United States Patent [19]

Atherton

[11] Patent Number: 4,728,932
[45] Date of Patent: Mar. 1, 1988

[54] DETECTOR FOR CAPACITIVE SENSING DEVICES

[75] Inventor: James H. Atherton, Ringoes, N.J.

[73] Assignee: Honeywell Inc., Minneapolis, Minn.

[21] Appl. No.: 890,216

[22] Filed: Jul. 25, 1986

[51] Int. Cl.$^4$ .............................................. G06F 3/02
[52] U.S. Cl. ............................ 340/365 C; 340/365 S; 324/60 C; 324/60 CD; 307/116; 361/131
[58] Field of Search ............ 340/365 C, 365 S, 365 E, 340/870, 37; 324/60 C, 60CD, 61 R; 307/350, 363, 362, 247 A, 116, 143; 73/724; 361/181; 200/DIG. 1

[56] References Cited

U.S. PATENT DOCUMENTS

| | | | |
|---|---|---|---|
| 3,750,113 | 7/1973 | Cencel | 340/365 C |
| 3,783,374 | 1/1974 | Eide et al. | 340/870.37 |
| 3,931,610 | 1/1976 | Marin et al. | 340/365 C |
| 4,157,539 | 6/1979 | Hunts et al. | 340/365 C |
| 4,163,222 | 7/1979 | Gove | 340/365 S |
| 4,175,239 | 11/1979 | Sandler | 340/365 C |
| 4,211,915 | 7/1980 | Miller et al. | 340/365 R |
| 4,266,144 | 5/1981 | Bristol | 307/116 |
| 4,305,135 | 12/1981 | Dahl et al. | 340/365 C |
| 4,322,977 | 4/1982 | Sell et al. | 324/60 C |
| 4,405,917 | 9/1983 | Chai | 340/365 C |
| 4,405,918 | 9/1983 | Wall et al. | 340/365 C |

OTHER PUBLICATIONS

Katz et al., "A MOS LSI Keyboard Interface Chip", Proceedings of 1978, IEEE International Solid-State Circuits Conference, Digest of Technical Papers, pp. 202, 203, 279 (Feb. 17, 1978).
Katz et al. "A MOS LSI Keyboard Interface Chip", IEEE Journal of Solid-State Circuits, vol. SC-13, No. 5, pp.561-565 (Oct. 1978).

Primary Examiner—John W. Caldwell, Sr.
Assistant Examiner—Alvin Oberley
Attorney, Agent, or Firm—Charles L. Rubow

[57] ABSTRACT

A method and circuit are disclosed for detecting the state of a variable capacitor by comparator means whose threshold voltage is impressed on first plates of the variable capacitor and a reference capacitor having a capacitance between the minimum and maximum capacitances of the variable capacitor, and charging and discharging the second plates of the variable and reference capacitors by equal amounts in opposite senses. The voltage on the first plates of the capacitors then changes in a sense dependent on the relative capacitance values of the capacitors and is compared with the threshold voltage by the comparator means.

21 Claims, 3 Drawing Figures

DETECTOR FOR CAPACITIVE SENSING DEVICES

BACKGROUND OF THE INVENTION

The invention disclosed herein relates generally to a method and means for detecting the states of capacitive sensing devices such as key actuated variable capacitors, and more particularly to a method and circuitry for reliably determining the states of variable capacitors in a plurality of such capacitors in which the capacitance change of any capacitor may be masked by the effective shunt capacitance of the other capacitors and other circuit elements.

Electronic keyboards have long comprised a primary form of input device for information handling and data processing systems. Capacitive keyboards are well known in the field of data input devices. They provide certain inherent advantages over electrical contact keyboards. These advantages particularly include mechanical simplicity, long life and absence of electrical signal problems caused by contact bounce and corrosion.

In order to reduce the cost and complexity of detection circuitry used with capacitive keyboards and in order to reduce the number of conductors necessary to connect such keyboards with external detection circuitry, it is known to provide for sequential scanning of the key actuated capacitors to determine key status. This may be accomplished by means of a matrix of row and column conductors, each key actuated capacitor being connected between a unique pair of conductors comprising one row and one column conductor. A drive signal may be sequentially impressed on conductors in one set of conductors while the conductors in the other set are sequentially addressed to detect signals coupled thereto.

However, as set forth in numerous publications, including U.S. Pat. No. 3,750,113 issued to J. Cencel on July 31, 1973, scanned capacitive keyboards suffer from another problem which is particularly significant in capacitively coupled systems. This problem stems from the fact that there is inherent capacitive coupling between every pair of elements in a keyboard. Thus, in a typical capacitive keyboard having a matrix of conductors including drive signal and sense signal conductors, a signal on any conductor will normally appear to some extent on every other conductor. Obviously, this phenomenon complicates the task of detecting which of an array of variable capacitors between pairs of conductors in the matrix is actuated.

As noted in the above identified patent, a variety of techniques have been employed in attempts to minimize problems caused by stray capacitive coupling. These techniques include the use of ground lines interleaved between the drive and/or sense conductors, ground planes and various forms of shielding. In addition, various electronic signal detection, verification and processing techniques have been employed to improve the reliability of detecting and distinguishing valid key actuation signals from signals caused by stray coupling. Some representative techniques are disclosed in U.S. Pat. Nos. 3,931,610 issued to R. Marin, et al on Jan. 6, 1976, 4,163,222 issued to D. Gove on July 31, 1979, and 4,211,915 issued to D. Miller, et al on July 8, 1980.

It is also known to maintain a reference potential on all conductors except for individual conductors while they are being addressed to effectively eliminate cross talk and interference in a capacitive keyboard in which an array of capacitors is sequentially scanned. This technique is shown in Katz, et al, "A MOS LSI Capacitive Keyboard Interface Chip", IEEE Journal of Solid-State Circuits, Vol. SC13, No. 5, pages 561-565, (October 1978), and U.S. Pat. No. 4,405,917 issued to T. Chai on Sept. 20, 1983.

The foregoing techniques are useful in reducing the effects of unintentional capacitive coupling through elements other than capacitors in a single row or column. However, a problem continues to exist in detecting a valid key actuation where the key is one of a plurality of actuated keys in the same row or column, as might occur if a key is actuated before previously actuated keys are released. More specifically, the capacitors associated with keys other than the key being addressed act as shunt capacitors between the sense conductor and ground or other reference potential. The change in voltage on the sense conductor due to actuation of a key is equal to the drive voltage times the capacitance of the capacitor associated with the key divided by the sum of the shunt capacitance and the key associated capacitance. If a number of keys other than the key of interest are actuated or a large shunt capacitance is otherwise present, the change in sensed voltage becomes small. This phenomenon is noted in previously identified U.S. Pat. No. 3,750,113 in which an amplifier configured for substantially unity gain, thus operating in a current amplifier mode, is employed to reduce the difficulties in correctly detecting key actuation.

The sensed voltage is typically compared with a fixed threshold reference to determine whether there is sufficient change to indicate actuation of a key. U.S. Pat. Nos. 4,175,239 issued to L. Sandler on Nov. 20, 1979 and 4,266,144 issued to R. Bristol on May 5, 1981 illustrate representative capacitive apparatus in which sensed voltages are compared with constant threshold or reference voltages. As the change in sensed voltage becomes small due to the simultaneous actuation of an increasing number of keys, reliable detection of key actuations becomes increasingy difficult. Techniques for overcoming this problem include increasing the drive voltage and/or maintaining tighter control over parasitic capacitances. Increasing the drive voltage is undesirable because it leads to increased power consumption and increased manufacturing costs. In general, any requirement to maintain tighter control over parasitic capacitances also results in increased manufacturing costs, and is therefore undesirable.

The present invention minimizes or avoids many of the foregoing difficulties by effectively establishing an adaptive reference against which key state dependent signals are sensed. Accordingly, key state is determined essentially from the polarity of the sensed signal. The adaptive feature permits relaxed requirements regarding parasitic capacitances which provide for cost reductions. In addition, circuitry for carrying out the present invention is well suited for fabrication with standard CMOS integrated circuit designs which provide for low power consumption and low cost.

SUMMARY OF THE INVENTION

The present invention is a method and apparatus for reliably detecting the state of a capacitor whose capacitance is variable between minimum and maximum values and whose capacitance changes may be masked by substantial shunt or parasitic capacitances. The method basically comprises periodically charging first plates of the variable capacitor and a reference capacitor whose capacitance is between the minimum and maximum capacitance values of the variable capacitor to the threshold voltage of a comparator, charging the second plates of the variable and reference capacitors so as to produce equal voltage changes of opposite senses and sensing the polarity of voltage change on the first plates of the capacitors. The polarity of voltage change is used by the comparator to produce an output dependent on whether the variable capacitance is smaller or larger than the reference capacitance.

Apparatus according to the invention basically comprises a comparator having its input terminal connected to the first plates of a variable capacitor and a reference capacitor whose capacitance is between the minimum and maximum capacitance values of the variable capacitor. A switch connected to the comparator is controlled by reset means to periodically force the voltage at the comparator input and first plates of the variable and reference capacitors to the comparator threshold voltage. Concurrently the reset means and related circuitry impresses a reference voltage and a first voltage different from the reference voltage on the second plates of the variable and reference capacitors. With the switch open, the comparator is operable to produce an output indicative of whether the voltage on the first plates of the variable and reference capacitors is smaller or larger than the threshold voltage, which is indicative of whether the variable capacitance is smaller or larger than the reference capacitance.

The comparator may comprise a pair of cross coupled inverters of which one having its output terminal connected to the first plates of the variable and reference capacitors is only capable of producing a substantially smaller current than the other inverter. Latch means may be provided for preserving the output of the comparator between determinations of the state of the variable capacitor.

DESCRIPTION OF THE PREFERRED EMBODIMENTS

Figure 1:
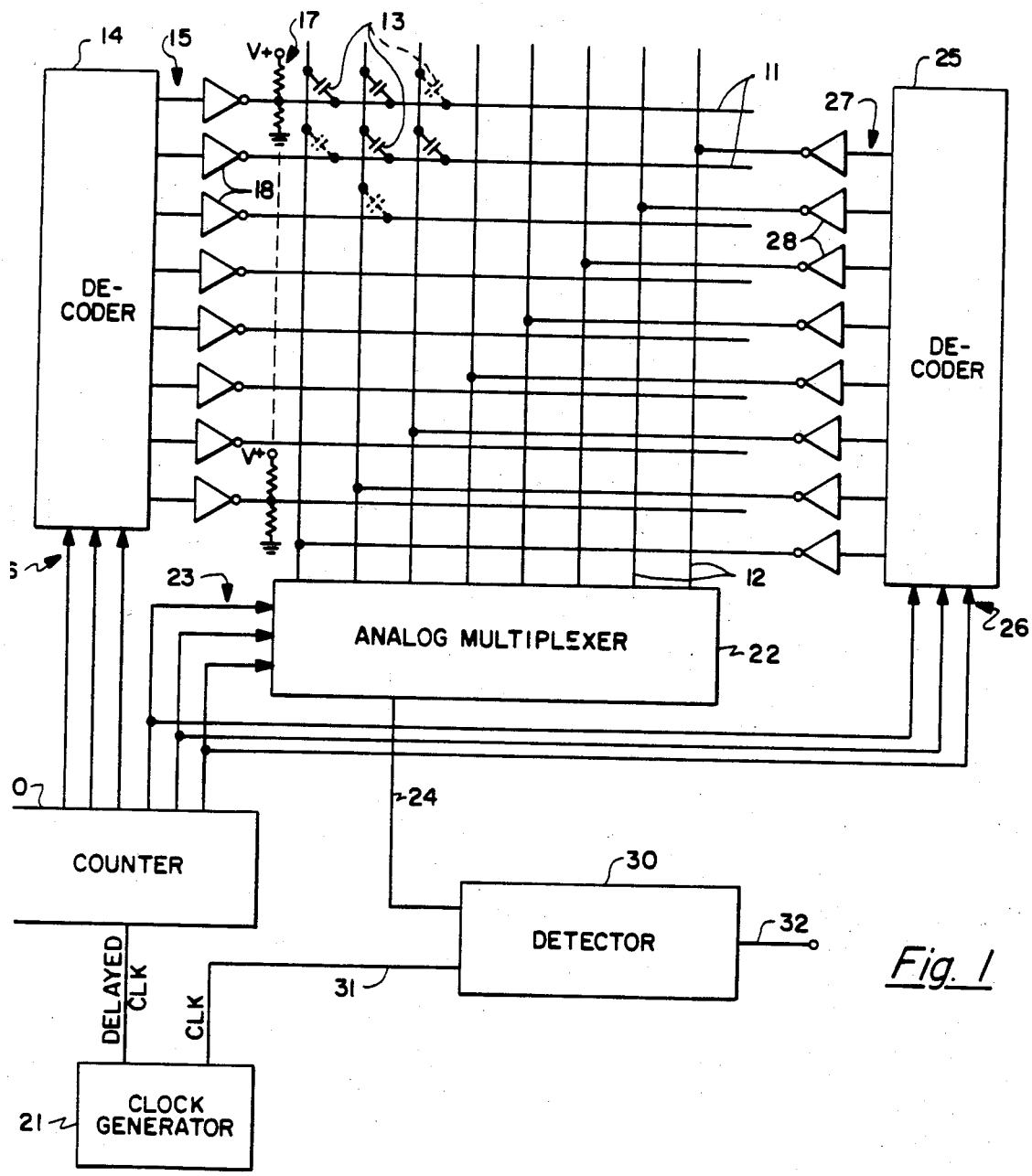
FIG. 1 is a general schematic block diagram of a first embodiment of capacitive keyboard apparatus including a detector in accordance with the present invention.
Figure 2:
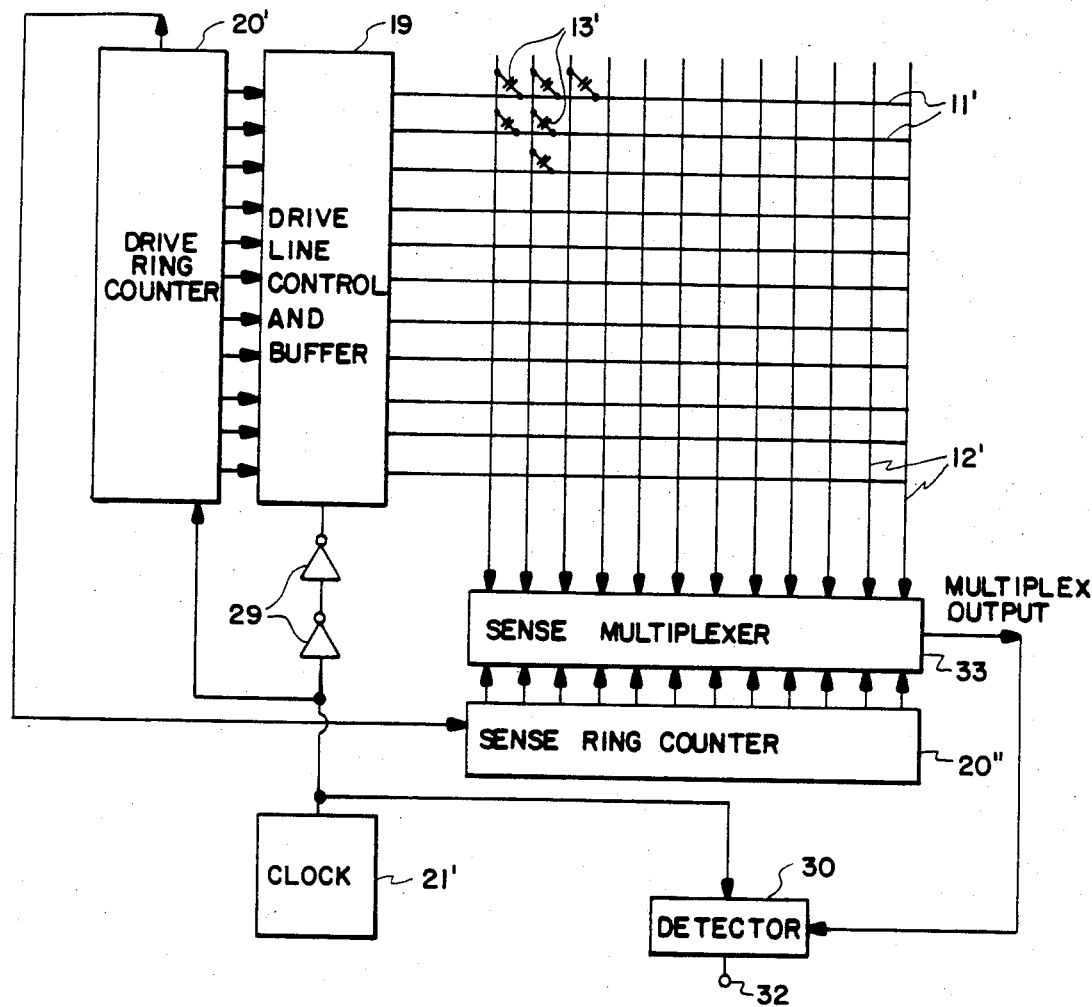
FIG. 2 is a general schematic block diagram of a second embodiment of capacitive keyboard apparatus including a detector in accordance with the present invention.

Alternative embodiments of capacitor keyboard apparatus embodying the present invention are illustrated in FIGS. 1 and 2. Schematically illustrated in FIG. 1 is an eight by eight matrix of capacitive keyboard conductors. The matrix includes a first set or plurality of conductors 11 to which drive pulses are supplied and a second set or plurality of conductors 12 on which signals are sensed. Although an eight by eight matrix is shown, the detector and detection method of the present invention may easily be applied to a matrix of any size. Also, although the conductors are represented by sets of parallel, horizontal and vertical lines for illustrative purposes, conductors in an actual keyboard matrix may follow a considerably more complex and irregular pattern.

As illustrated in FIG. 1, a capacitor 13 is located at each crossing of conductors in the first and second sets. Accordingly, the capacitors are shown and may be described as an array of capacitors comprising a plurality of rows and a plurality of columns of capacitors. For purposes of the following description, the terms "rows" and "columns" refer to an idealized electrical layout of a keyboard. The terms are intended to cover a range of physical configurations regardless of whether or not the capacitors are physically arranged in regular columns and rows. Although only a few capacitors are illustrated, it should be understood that, in fact, there is such a capacitor at each crossing of a conductor in one set with a conductor in the other set of conductors.

Capacitors 13 are key actuated variable capacitors each having a fixed plate and a movable plate, and may be referred to as capacitive key switches. One of the plates of each of the capacitors is connected to one of conductors 11. The other plate of each capacitor is connected to one of conductors 12. Accordingly, each capacitor provides variable capacitive coupling between a unique pair of conductors comprising one conductor from each set of conductors. It may also be observed that unless suitable provisions are made, there will be stray capacitive coupling to some degree between each conductor and every other conductor in the first and second sets of conductors.

Conductors 11 are sequentially supplied with a drive signal by scanning means including a first decoder or demultiplexer 14 having a plurality of output terminals 15 and address terminal means 16. Demultiplexer 14 may be one of various suitable commercially available demultiplexers, such as a 74154 4-line to 16-line decoder/demultiplexer manufactured by Texas Instruments Inc. The output terminals of such a demultiplexer are normally at a logical high state, and may be selectively caused to go to a logical low state in response to a suitable address supplied to address terminal means 16.

A bias means or network identified by reference numeral 17 is connected to each of conductors 11, and tends to maintain the conductors at a predetermined positive voltage with reference to electrical ground. Only two of the conductors are shown with the bias means for illustrative purposes. However, it should be understood that each of conductors 11 is biased to the predetermined voltage.

Each of the output terminals 15 of demultiplexer 14 is connected to a separate one of conductors 11 through a separate one of a plurality of inverters 18. Each of inverters 18 operates such that when supplied with a logical high input signal, its output is at a reference potential, which is typically electrical ground. When an inverter 18 is supplied with a logical, low input signal, the potential on its output terminal and the conductor connected thereto is determined by the associated bias network which raises the voltage on that conductor to the predetermined voltage. The plates of capacitors 13 connected to that conductor are correspondingly charged to the predetermined positive voltage.

Address signals for demultiplexer 14 are produced by a counter 20 which receives a periodic clock signal from a clock generator 21. For reasons which will hereinafter be described in greater detail, the clock signal supplied to counter 20 is referred to as a "delayed" clock signal.

Counter 20 is shown as having six output terminals over which a binary count signal is provided. The least significant bits of the binary count signal comprise the address supplied to decoder 14. The most significant bits comprise an address for an analog multiplexer 22 having address terminal means 23. Multiplexer 22 is connected to multiplex signals between conductors 12 and a further conductor 24 in response to the address signals supplied to address terminal means 23. Thus, conductors 12 are sequentially addressed by multiplexer 22 so that each of conductors 12 in turn is effectively connected to conductor 24. While each conductor 12 is being addressed, conductors 11 are sequentially impressed with the predetermined voltage.

The most significant bits of the count signal produced by counter 20 also comprise an address for a decoder 25 having address terminal means 26 and a plurality of output terminals 27, each of which is connected to a separate one of conductors 12 through an inverter identified by reference numeral 28. The purpose of decoder 25 and inverters 28 is to maintain conductors 12 at the reference potential except for individual conductors while they are being addressed by multiplexer 22. Thus, inactive sense conductors 12 are maintained at electrical ground to minimize problems caused by stray capacitive coupling and cross talk.

Reference numeral 30 identifies a detector in accordance with the present invention having an input terminal connected to conductor 24, a clock terminal 31 connected to receive a periodic clock signal from clock generator 21 and an output terminal 32 at which is produced a signal sequentially indicative of the states of capacitors 13. The design and operation of detector 30 can best be understood by reference to the schematic circuit diagram of FIG. 3 which will be discussed in detail after a brief description of the keyboard apparatus of FIG. 2.

Schematically illustrated in FIG. 2 is a matrix of capacitive keyboard conductors similar to that illustrated in FIG. 1. The matrix includes a first set of conductors 11' to which drive pulses are supplied and a second set of conductors 12' on which signals are sensed. A key actuable variable capacitor 13' is located at each crossing of conductors in the first and second sets.

Conductors 11' are sequentially supplied with a drive signal by scanning means including a drive line control and buffer circuit 19 and a drive ring counter 20'. Control circuit 19 provides a function similar to that of bias network 17 and inverters 18 in the apparatus of FIG. 1. Under the control of drive ring counter 20' control circuit 19 impresses a predetermined voltage on each of conductors 11' in turn, while maintaining all other conductors 11' at a reference potential (electrical ground).

Drive line control circuit 19 and drive ring counter 20' receive clock signals from a system clock 21' which also supplies clock signals to detector 30. As shown, the clock signals supplied to counter 20' and detector 30 are undelayed, while the clock signals supplied to control circuit 19 are slightly delayed by passing the signals through a series connected pair of inverters 29. The slight delay permits the detector to become fully settled with a proper precharge on the input of a comparator therein, and enabled to accept a signal for comparison before a drive signal is supplied. This prevents the voltage to be sensed from being dissipated before sensing occurs, and thus maximizes system sensitivity.

After each complete operating cycle of drive ring counter 20', it supplies a signal to a sense ring counter 20'' which controls a sense multiplexer 33 connected to sense conductors 12'. Sense multiplexer 33 operates to provide a function similar to that of multiplexer 22, decoder 25 and inverters 28 in the apparatus of FIG. 1. Conductors 12' are maintained at the reference potential except for individual conductors while they are being addressed. Each conductor 12' is sequentially connected to detector 30 through the output terminal of sense multiplexer 33. As is apparent, all of drive conductors 11' are scanned while each sense conductor 12' is being addressed, whereupon the next sense conductor in the sequence is addressed.

Figure 3:
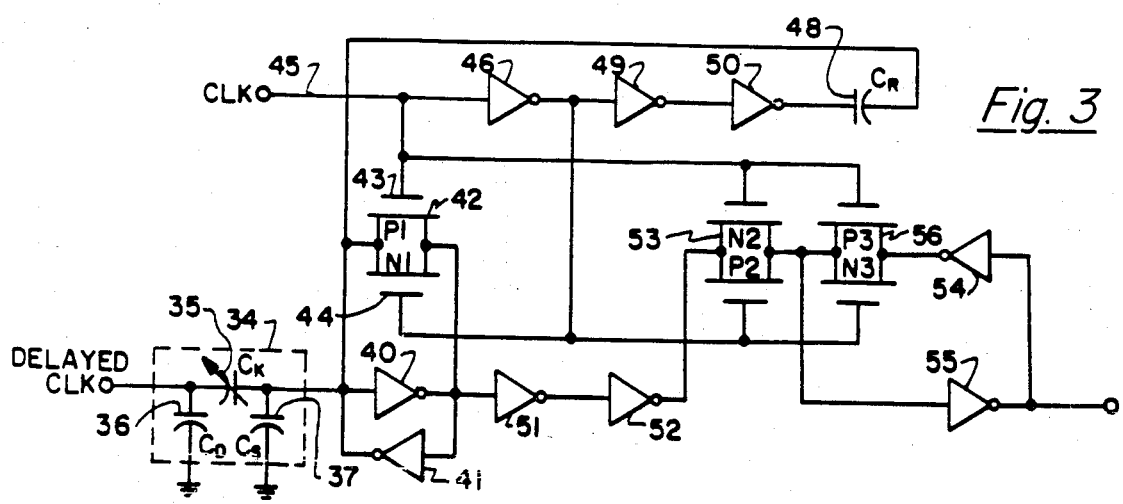
FIG. 3 is a schematic circuit diagram of a preferred embodiment of the detector shown in FIGS. 1 and 2.

In FIG. 3, the dashed line block identified by reference numeral 34 is the equivalent circuit of one of capacitors 13, 13' and its associated conductors 11, 11' and 12, 12' in FIGS. 1 and 2. Equivalent circuit 34 includes a variable capacitor 35 which represents one of the capacitive key switches in the keyboard array. Equivalent circuit 34 is shown connected between a source of delayed clock signals which may comprise clock generator 21 and the input terminal of a detector circuit. A capacitor 36 shown connected between one plate of capacitor 35 and ground represents the effective shunt capacitance between the drive conductor 11, 11' to which capacitor 35 is connected and ground. Similarly, a capacitor 37 shown connected between the other plate of capacitor 35 and ground represents shunt or parasitic capacitance associated with the sense conductor 12, 12' to which capacitor 35 is connected.

For purposes of the present analysis, the capacitance represented by capacitor 36 can be ignored since it is assumed that the drive circuitry has sufficient output capacity to establish whatever drive voltage is required on drive conductors 11, 11'. However, the capacitance represented by capacitor 37 may have a substantial effect on the signals coupled to sense conductors 12, 12' and the operation of detection circuitry for sensing the state of the capacitive key switches.

The detector circuit generally comprises a comparator which is shown as a regenerative amplifier more specifically formed of a pair of cross coupled inverters 40 and 41. Inverter 41 which has its output terminal connected to the input terminal of the detector circuit is designed with a very long narrow channel so that its current producing capability is substantially limited. The function of inverter 41 is to provide a slight bias to insure that the input signal to inverter 40 does not completely disappear.

A transmission gate comprising field effect transmission device 42 is connected between the output and input terminals of inverter 40. Transmission gate 42 has a gate electrodes 43 and 44 of which electrode 43 is connected to a clock terminal 45 through which it receives a clock signal from clock generator 21. Gate electrode 44 is connected to clock terminal 45 through an inverter 46. Transmission gate 42 operates such that when the clock signal is low the gate is enabled to electrically connect the output and input terminals of inverter 40.

The output terminal of inverter 46 is connected to one plate of a reference capacitor 48 through a series connected pair of inverters 49 and 50. The other plate of capacitor 48 is connected to the sense plate of capacitor 35 at a sense node which is connected to the input terminal of inverter 40. Inverters 49 and 50 serve to slightly delay charging and discharging of capacitor 48 with respect to transitions of the clock signal.

The output terminal of inverter 40 is connected through inverters 51 and 52 and a transmission gate 53 to a latch comprising inverters 54 and 55 which are cross coupled through a transmission gate 56. Transmission gates 53 and 56 are similar to transmission gate 42, and each includes a pair of gate electrodes, one of which is connected to the clock input terminal and the other of which is connected to the output terminal of inverter 46. Transmission gates 53 and 56 are disabled and enabled respectively when the clock signal is low.

In operation, enabling of gate 42 when the clock signal is low forces the input terminal of inverter 40 and the plates of capacitors 35 and 48 connected thereto to a precharge voltage equal to the threshold voltage of the inverter. This voltage is also applied to first plates of each of capacitors 35, 37 and 48. A second plate of capacitor 35 is at the reference voltage or electrical ground. A second plate of capacitor 48 is at the predetermined voltage (the supply voltage of inverter 50).

When the clock signal goes high, gate 42 is disabled, thus leaving the input terminal of inverter 40 and the capacitor plates connected thereto free to assume a different voltage. This transition of the clock also discharges the second plate of capacitor 48 from the predetermined voltage to the reference voltage, and after a short delay charges the second plate of capacitor 35 from the reference voltage to the predetermined voltage. These voltage changes in opposite senses are coupled through capacitors 35 and 48 to the input terminal of inverter 40. Depending on the relative capacitance values of capacitors 35 and 48, the voltage at the input terminal of inverter 40 will increase or decrease from the precharge or threshold voltage. More specifically, if the capacitance of capacitor 35 is larger than the capacitance of capacitor 48, as would be the case if the key corresponding to capacitor 35 were actuated, the voltage at the input terminal of inverter 40 would increase. This increase would be amplified by inverter 40 and following inverters 51 and 52, and supplied to transmission gate 53 which is enabled by a high clock signal. The low output of inverter 52 would result in a high output of inverter 55 which supplies a detector circuit output indicative of an actuated key.

When the clock signal goes low, transmission gate 53 is disabled and transmission gate 56 is enabled. Transmission gate 56 accordingly electrically cross couples inverters 54 and 55 which cause inverter 55 to preserve the existing output signal.

Conversely, if the key associated with capacitor 35 is not actuated, capacitor 35 presents a smaller capacitance than does capacitor 48, and the voltage at the input terminal of inverter 40 decreases. This results in a high signal being supplied to the latch through transmission gate 53 and a low output from inverter 55 and the detector. Upon the transition of the clock signal from high to low, the states of transmission gates 53 and 56 are changed and the output signal is again preserved until the next clock transition.

In accordance with the foregoing description, the applicant's detector circuit effectively establishes the threshold voltage of the comparator as an adaptive reference against which a voltage on the sense side of a key switch capacitor is compared. Deviation of this voltage, as occurs due to a change in capacitive switch state after establishing the threshold voltage, is detected by the comparator and causes a corresponding detection circuit output signal. Since the voltage change at the input terminal of the comparator required for detection is almost negligible, the size of the shunt or parasitic capacitance has substantially no effect on key state detection.

Although a specific embodiment of the applicant's invention has been shown and described for illustrative purposes, a variety of other embodiments and modifications will be apparent to those skilled in the relevant arts. It is not intended that coverage be limited to the embodiment disclosed herein, but only by the terms of the following claims.

The embodiments of the invention in which an exclusive property or right is claimed are defined as follows:

1. A detector for producing an output indicative of the state of a variable capacitor having first and second plates and minimum and maximum capacitance values, comprising:

a reference capacitor having first and second plates and a capacitance value between the minimum and maximum capacitance values of the variable capacitor;

a sense node adapted to connect the first plates of the variable capacitor and said reference capacitor;

a comparator having an input terminal, and an output terminal at which is produced an output signal indicative of whether the voltage at the input terminal is smaller or larger than a precharge voltage;

means connecting the input terminal of said comparator to said sense node;

precharging means connected to the input terminal of said comparator and said sense node, said precharging means being operable to impress the precharge voltage on the input terminal of said comparator and the first plates of the variable capacitor and said reference capacitor during a first time period, and, during a second time period, to allow the voltage on said sense node and connected input terminal of said comparator to assume a voltage different from the precharge voltage; and a drive signal generator connected to the second plate of said reference capacitor and having a drive terminal adapted to be connected to the second terminal of the variable capacitor, said drive signal generator being operable to impress first and second predetermined voltages of different values on the second plates of said reference and variable capacitors respectively during the first time period and to impress the second and first predetermined voltages on the second plates of said reference and variable capacitors respectively during the second time period, whereby, during the second time period, the capacitance value of the variable capacitor determines whether the voltage on the input terminal of said comparator is smaller or larger than the precharge voltage.

2. A detector for producing an output indicative of the state of a variable capacitor having first and second plates and minimum and maximum capacitance values, comprising:

comparator means having an input terminal adapted to be connected to the first plate of the variable capacitor and an output terminal at which is produced an output signal indicative of whether the voltage at the input terminal is smaller or larger than a threshold voltage;

first switch means connected to the input and output terminals of said comparator means, said comparator means and said first switch means, when enabled, being operable to cause the voltage at the input terminal of said comparator means to be substantially equal to the threshold voltage;

a reference capacitor having first and second plates, the first plate being connected to the input terminal of said comparator means, said reference capacitor having a capacitance between the minimum and maximum capacitance values of the variable capacitor; and reset means adapted to receive a reset signal of first or second states and operable when receiving a reset signal of the first state to enable said first switch means and charge the second plate of said reference capacitor to a first predetermined voltage, said reset means further being operable when receiving a reset signal of the second state to disable said first switch means and discharge the second plate of said reference capacitor to a second predetermined voltage, whereby if the second plate of the variable capacitor is charged in response to the reset signal of the second state so that its voltage increases by an amount equal to the difference between the first and second predetermined voltages, a voltage is produced at the input terminal of said comparator means which is smaller or larger than the threshold voltage depending on whether the capacitance of the variable capacitor is smaller or larger than the capacitance of the reference capacitor.

3. The detector of claim 2 wherein said comparator means comprises first and second cross coupled inverters.

4. The detector of claim 3 wherein:
said first inverter includes an input terminal which comprises the input terminal of said comparator means; and
said second inverter is only capable of producing substantially less current than said first inverter.

5. The detector of claim 4 wherein:
said first switch means comprises a first transmission gate having first and second complimentary control electrodes, said first transmission gate being enabled by signals of first and second states at its first and second control electrodes respectively; and
said reset means comprises a third inverter having input and output terminals and means connecting the input and output terminals of said third inverter to the first and second control electrodes respectively of said first transmission gate, said reset means further including means connecting the output terminal of said third inverter to the second plate of said reference capacitor.

6. The detector of claim 2 further including latch means connected to said reset means and the output terminal of said comparator means, and operable to receive the output signal of said comparator means when the reset signal is of the second state and to produce an output signal corresponding to the received output signal when the reset signal is of the first state.

7. The detector of claim 6, wherein said latch means comprises first and second inverters each having an input terminal and an output terminal, said first and second inverters being cross coupled through second switch means, the input terminal of said first inverter being connected to the output terminal of said comparator means through third switch means, the second and third switch means being connected to receive signals from said reset means, said second and third switch means further being enabled and disenabled respectively when said reset signal is of the first state, and disenabled and enabled respectively when the reset signal is of the second state.

8. The detector of claim 7 wherein:
said first switch means comprises a first transmission gate having first and second complimentary control electrodes, said first transmission gate being enabled by signals of first and second states at its first and second control electrodes respectively;
said reset means comprises a third inverter having input and output terminals and means connecting the input and output terminals of said third inverter to the first and second control electrodes of said first transmission gate respectively; and
said second and third switch means comprise second and third transmission gates respectively, each including first and second complimentary control electrodes and each being enabled by signals of first and second states at its first and second control electrodes respectively, the first control electrode of the second transmission gate and the second control terminal of the third transmission gate being connected to the input terminal of said third inverter and the second control electrode of the second transmission gate and the first control electrode of the third transmission gate being connected to the output terminal of said third inverter.

9. Capacitive keyboard apparatus comprising:
an array of capacitive key switches each including a capacitor having first and second plates and minimum and maximum capacitance values;
a clock generator for generating first and second alternating clock signals;
scanning means connected to said clock generator and operable in response to the first clock signals to sequentially charge the first plates of the capacitors in said array from a first predetermined voltage to a second predetermined voltage and to provide for sequential sensing of the states of the capacitors in said array;
comparator means having an input terminal connected to said scanning means for sequentially receiving signals corresponding to the voltages on the second plates of individual capacitors in said array, a reset terminal connected to said clock generator, and an output terminal at which is produced an output signal indicative of whether the voltage at the input terminal is less or greater than a threshold voltage, said comparator means being operable in response to the second clock signals to cause the voltage at the input teminal and the second plate of the capacitor whose state is being sensed to be substantially equal to the threshold voltage;
a reference capacitor having first and second plates of which the first plate is connected to the input terminal of said comparator means, said reference capacitor having a capacitance between minimum and maximum capacitance values of the capacitors in said array; and
reset means connected to said clock generator and operable in response to the second clock signals to charge the second plate of said reference capacitor so that its voltage increases by an amount equal to the difference between the first and second predetermined voltages, said reset means further being operable in response to the first clock signals to discharge the second plate of said reference capacitor so that its voltage decreases by said difference, whereby upon occurrence of the first clock signals said comparator means produces an output signal sequentially indicative of whether the capacitances in said array are smaller or larger than that of the reference capacitor.

10. The keyboard apparatus of claim 9 wherein:
each capacitor in said array has a fixed plate and a movable plate, the fixed plates being connected to a first set of conductors and the movable plates being connected to a second set of conductors so that each capacitor is connected to a unique pair of conductors comprising one conductor of each of the first and second sets of conductors; and
said scanning means sequentially supplies pulses of the first predetermined voltage to conductors in one of the first and second sets of conductors and sequentially permits the voltages on conductor in the other of the first and second sets of conductors to vary.

11. The capacitive keyboard apparatus of claim 10 wherein said comparator means comprises:
a comparator having an input terminal connected to said scanning means and an output terminal at which the output signal of said comparator means is produced; and
first switch means connected between the input and output terminals of said comparator, said comparator and said first switch means being operable in response to the second clock signals to electrically connect the output and input terminals of said comparator so as to force the voltage at the input terminal to the threshold voltage.

12. The keyboard apparatus of claim 11 wherein said comparator comprises:
first inverter having an input terminal to said scanning means and an output terminal at which the output signal of said comparator is produced; and
a second inverter having input and output terminals connected to the output and input terminals respectively of said first inverter.

13. The keyboard apparatus of claim 12 wherein said second inverter is capable of producing only substantially less current than said first inverter.

14. The keyboard apparatus of claim 9 further including latch means connected to said clock generator and operable to receive the output signal of said comparator means during said first clock signals and to maintain an output signal corresponding to the received output signal during the second clock signals.

15. The keyboard apparatus of claim 14 wherein said clock generator, said scanning means, said comparator means and said reset means are operable to discharge the second plate of said reference capacitor before charging the first plate of the capacitor whose state is being sensed.

16. The keyboard apparatus of claim 15 wherein:
said clock generator produces delayed first and second alternating clock signals substantially identical to but delayed in time from the first and second alternating clock signals;
said reset means is connected to receive the first and second clock signals in response to which the second plate of said reference capacitor is discharge; and
said scanning means is connected to receive the delayed first and second clock signals in response to which the first plate of the capacitors in said matrix are sequentially charged to the second predetermined voltage.

17. A method for detecting the state of a variable capacitor by means of circuitry including a reference capacitor having a capacitance between the minimum and maximum capacitance values of the variable capacitor and comparator means which changes output states at an input threshold voltage, the method comprising the steps of:
providing an inverter having input and output terminals, the input terminal being connected to first plates of the variable and reference capacitors;
during a first interval, connecting the output terminal of the inverter to its input terminal so that the first plates of the variable and reference capacitors are charged to the threshold voltage of the inverter;
during a subsequent interval, disconnecting the output terminal of the inverter from its input terminal and charging second plates of the variable and reference capacitors so that the voltages on the second plates change by equal amounts in opposite senses, whereby the voltage on the first plates of the variable and fixed capacitors is caused to be less or greater than the threshold voltage if the capacitance of the variable capacitor is smaller or greater respectively than the capacitance of the reference capacitor; and
utilizing the output signal of the inverter during the subsequent interval to indicate the state of the variable capacitor.

18. The method of claim 17 wherein the step of charging the second plates comprises:
establishing a reference voltage on the second plate of one of the variable capacitor and the reference capacitor, and establishing a first voltage different from the reference voltage on the second plate of the other of the reference capacitor and the variable capacitor;
discharging the second plate of the variable or reference capacitor which is at the first voltage to the reference voltage; and
charging the second plate of the variable or reference capacitor which is at the reference voltage to the first voltage.

19. The method of claim 18 wherein the step of charging the first plates of the variable and reference capacitors is performed simultaneously with the step of establishing a reference voltage and first voltage on the second plates of the variable and reference capacitors, and performed alternately with the steps of discharging and charging the second plates of the variable and reference capacitors respectively.

20. The method of claim 19 comprising the further step of preserving the output signal of the comparator means between successive occurrences of controlling the comparator means in accordance with the voltage on the first plates of the variable and reference capacitors.

21. The method of claim 20 wherein, in the step of discharging and charging the second plates of the variable and reference capacitors, the second plate of the reference capacitor is discharged from the first voltage to the reference voltage and then the second plate of the variable capacitor is charged from the reference voltage to the first voltage.

* * * * *